United States Patent
Enquist

Patent Number: 6,107,151
Date of Patent: Aug. 22, 2000

[54] HETEROJUNCTION BIPOLAR TRANSISTOR AND METHOD OF MANUFACTURING

[75] Inventor: Paul Enquist, Cary, N.C.

[73] Assignee: Research Triangle Institute, Research Triangle Park, N.C.

[21] Appl. No.: 09/074,652

[22] Filed: May 8, 1998

Related U.S. Application Data

[60] Provisional application No. 60/046,026, May 9, 1997.

[51] Int. Cl.[7] .................................................. H01L 21/331
[52] U.S. Cl. .......................... 438/309; 438/312; 438/584
[58] Field of Search ................................. 438/170, 309, 438/312, 199, 584

[56] References Cited

U.S. PATENT DOCUMENTS

| | | | |
|---|---|---|---|
| 4,593,305 | 6/1986 | Kurata et al. | 257/198 |
| 4,794,440 | 12/1988 | Capasso et al. | 257/191 |
| 4,939,102 | 7/1990 | Hamm et al. | 437/107 |
| 5,158,897 | 10/1992 | Sato et al. | 438/515 |
| 5,166,083 | 11/1992 | Bayraktaroglu | 438/170 |
| 5,206,524 | 4/1993 | Chen et al. | 257/29 |
| 5,321,301 | 6/1994 | Sato et al. | 257/592 |
| 5,387,807 | 2/1995 | Bayraktaroglu | 257/197 |
| 5,468,658 | 11/1995 | Bayraktaroglu | 438/312 |
| 5,481,120 | 1/1996 | Mochizuki et al. | 257/49 |
| 5,557,117 | 9/1996 | Matsuoka et al. | 257/184 |
| 5,672,522 | 9/1997 | Strait et al. | 438/312 |

OTHER PUBLICATIONS

Grovenor, C.R.M.; Microelectronic Materials, Institute of Physics Publishing, Bristol, pp. 16–19, Jan. 1989.

*Primary Examiner*—John F. Niebling
*Assistant Examiner*—Christopher Lattin
*Attorney, Agent, or Firm*—Oblon, Spivak, McClelland, Maier & Neustadt, P.C.

[57] ABSTRACT

A heterojunction bipolar transistor structure grown with organometallic vapor phase epitaxy (OVMPE) which uses zinc as the base dopant. The HBT structure has eight layers grown on a substrate, including n-type doped first, second, third, fifth, sixth, seventh, and eighth layers and a p-type zinc doped fourth layer. The first layer is a thicker, moderately doped n-type layer compared to the thinner, higher doped n-type second layer. The seventh layer is a thicker, moderately doped n-type layer compared to the thinner, higher doped n-type eighth layer. In addition, some or perhaps all of the layers have a high V/III ratio of 10–100 used to increase the gallium vacancies and reduce the diffusion of zinc from the base layer. Further, annealing of the structure is performed during growth to minimize gallium interstitials and to inhibit the diffusion of zinc.

18 Claims, 3 Drawing Sheets

HETEROJUNCTION BIPOLAR TRANSISTOR AND METHOD OF MANUFACTURING

This application claims benefit of Provisional Appl. 60/046,026 filed May 9, 1997.

BACKGROUND OF THE INVENTION

1. Field of the Invention

This invention relates to a heterojunction bipolar transistor (HBT) and method of manufacturing an HBT, and more particularly to an HBT formed by organometallic vapor phase epitaxy (OMVPE) using zinc as the base dopant.

2. Discussion of the Background

A considerable amount of testing (qualification) with respect to, for example, the reliability and performance of heterojunction bipolar transistor (HBT) structures is needed prior to the device entering the manufacturing stage.

Some of the methods used relating to the growth of HBT structures include molecular beam epitaxy (MBE) and organometallic vapor phase epitaxy (OMVPE).

FIG. 1 illustrates a background HBT epitaxy device structure grown by MBE or OMVPE. In FIG. 1, layer 1 is an n-type (n+) doped GaAs collector contact with a doping concentration between $2 \times 10^{18} - 1 \times 10^{19}$ cm$^{-3}$ and a thickness between 4,000–7,000 Å grown on a GaAs substrate S, layer 2 is an n-type (n−) doped GaAs collector transit layer with a doping concentration between $7 \times 10^{15} - 5 \times 10^{16}$ cm$^{-3}$ and a thickness between 4,000–15,000 Å, and layer 3 is a p-type (p+) doped GaAs base with a doping concentration between $1 \times 10^{19} - 1 \times 10^{20}$ cm$^{-3}$ and a thickness between 500–1,000 Å. In addition, layer 4 is an n-type (n) doped $Al_xGa_{(1-x)}As$ emitter (0.2<x<0.4) with a doping concentration between $1 \times 10^{17} - 1 \times 10^{18}$ cm$^{-3}$ and a thickness between 300–2,000 Å, layer 5 is an n-type (n+) doped $Al_xGa_{(1-x)}As$ graded (0.2<x<0.4 linearly graded to 0.0) layer with a doping concentration between $1 \times 10^{18} - 1 \times 10^{19}$ cm$^{-3}$ and a thickness between 200–500 Å, and layer 6 is an n-type (n+) doped emitter contact with a doping concentration between $1 \times 10^{18} - 1 \times 10^{19}$ cm$^{-3}$ and a thickness between 500–3,000 Å.

Many modifications of this structure are possible, such as the emitter contact layer 6 including combinations of GaAs and $In_yGa_{(1-y)}As$. For example, the emitter contact may include $In_yGa_{(1-y)}As$ (0.4<y<0.6) with a doping concentration between $5 \times 10^{18} - 1 \times 10^{19}$ cm$^{-3}$ and a thickness between 500–1,000 Å or the emitter contact may include n+ GaAs with a doping concentration between $1 \times 10^{18} - 1 \times 10^{19}$ cm$^{-3}$ and a thickness between 500–2,000 Å. In addition, an n+ $In_yGa_{(1-y)}As$ graded region (0.4<y<0.6 linearly graded to 0.0) with a doping concentration between $5 \times 10^{18} - 1 \times 10^{19}$ cm$^{-3}$ and a thickness between 500–1,000 Å may be used. A further modification is that the AlGaAs emitter (layer 4) may be replaced with GaInP or an n-type (n) doped AlGaAs graded layer may be used between the emitter and base to reduce the turn-on voltage. Still further, the p+ GaAs base (layer 3) may include AlGaAs and/or an InGaAs graded region to accelerate electrons across the base, and a variety of other modifications may be used to optimize various aspects of performance. However, each of the modifications listed above include a p+ base (layer 3).

During the growth of HBT structures with MBE or OVMPE, the five most likely p-type dopants used are cadmium (Cd), magnesium (Mg), carbon (C), Be and Zn. Be is the preferred choice as the p-type dopant for growing HBTs with MBE, primarily due to its high solubility, good minority carrier lifetime, and low diffusion coefficient under optimized growth conditions. However, Be is not a useful dopant for growing HBT structures with OMVPE because BeO is extremely toxic. For example, the use of diethylberyllium (DEBe) as a p-type dopant for OMVPE GaAs leaves deposits in the reaction cell and exhaust of OMVPE reactors, which must be routinely cleaned. Another reason Be is not useful as a p-type dopant is that the availability of DEBe is currently limited.

The major problem with using Cd as a base dopant is the difficulty of obtaining carrier concentrations above $1 \times 10^{18}$ cm$^{-3}$. Mg has the advantage of a low diffusion coefficient; however, the use of bismethylcyclopentadienylmagnesium ($MCp_2Mg$) as a Mg source has not resulted in abrupt dopant profiles.

The aforementioned problems leave the dopants of Zn and carbon as the primary candidates for OVMPE growth of HBT structures.

To date, the qualification of HBT structures grown with OVMPE has focused primarily on carbon as the base dopant. This is primarily due to the lower diffusion coefficient of carbon compared to Zn and the commonly held belief that this lower diffusion coefficient will yield improved reliability. However, the demonstrated reliability of HBT structures grown with OVMPE using carbon as the base dopant has been significantly worse than those grown with MBE using Be as the base dopant. Thus, the qualification of HBT structures grown with OMVPE using carbon as the base dopant has not been as successful as that grown with MBE using Be as the base dopant.

Furthermore, the use of carbon doping in OMVPE HBT structures causes additional reliability problems and reduced performance (e.g., reduced minority carrier lifetime and accelerated current gain degradation). Research has been performed showing that the lifetime, carrier concentration, and mobility of GaAs HBT structures grown with OVMPE using carbon as an acceptor dopant degrade with post growth annealing. These effects may be due to one or a combination of hydrogen passivation, dopant precipitation, and/or lattice relaxation. Although excessive doping concentrations with carbon does not result in significantly enhanced diffusion, it may result in precipitation. These observations are consistent with the inferior reliability in carbon doped OMVPE HBT structures compared to that observed with Be doped MBE HBT structures.

SUMMARY OF THE INVENTION

Accordingly, one object of the invention is to provide a heterojunction bipolar transistor (HBT) structure grown with OMVPE using Zn as the base dopant.

Another object of the present invention is to use Zn as a base dopant to produce reliable HET structures grown with OMVPE which will facilitate their qualification for manufacturing.

A further object of the present invention is to control the diffusion coefficient of the Zn dopant of HBT structures to increase its performance and reliability.

A still further object of the present invention is to control the diffusion coefficient of Zn by reducing the emitter and/or collector contact regions to a thickness of approximately the depletion region, thus minimizing n+ type doping regions which tend to create gallium interstitials and increase Zn diffusion.

Yet another object of the present invention is to control the diffusion of Zn by annealing during growth of the structure to suppress the substitutional-interstitial diffusion mechanism. In particular, the annealing process is most useful after growth of some or all of the collector but before growth of the base.

Another object of the present invention is to prevent the diffusion of Zn by using high V/III ratios in any of the base, collector, and emitter layers to increase gallium vacancies which reduce the diffusion of Zn.

These and other objects are achieved by providing an HBT structure which suppresses the diffusion of Zn by inhibiting the substitional-interstitial diffusion mechanism. In particular, any combination of the methods of a) separating the emitter and/or collector contact regions into a thicker, moderately doped portion and a thinner, higher doped portion, b) using high V/III ratios, and c) annealing the structure during growth can be used to inhibit the substitutional-interstitial diffusion mechanism which causes the diffusion of Zn from the base toward the collector and/or emitter. The emitter and collector thinner contact layers can be reduced to a thickness of approximately the depletion region. The thinner contact layers reduce the amount of crystal defects which can then diffuse to the base and cause Zn to diffuse. The use of high V/III ratios increases the amount of gallium vacancies. This increase of gallium vacancies retards the diffusion of Zn. The use of high V/III layers can be used in any of the layers of an HBT structure to retard the diffusion of Zn. The annealing process is used to allow problematic crystal defects to diffuse to the surface and out of the material. The annealing process is most useful during growth of some or all of the collector but before growth of the base.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
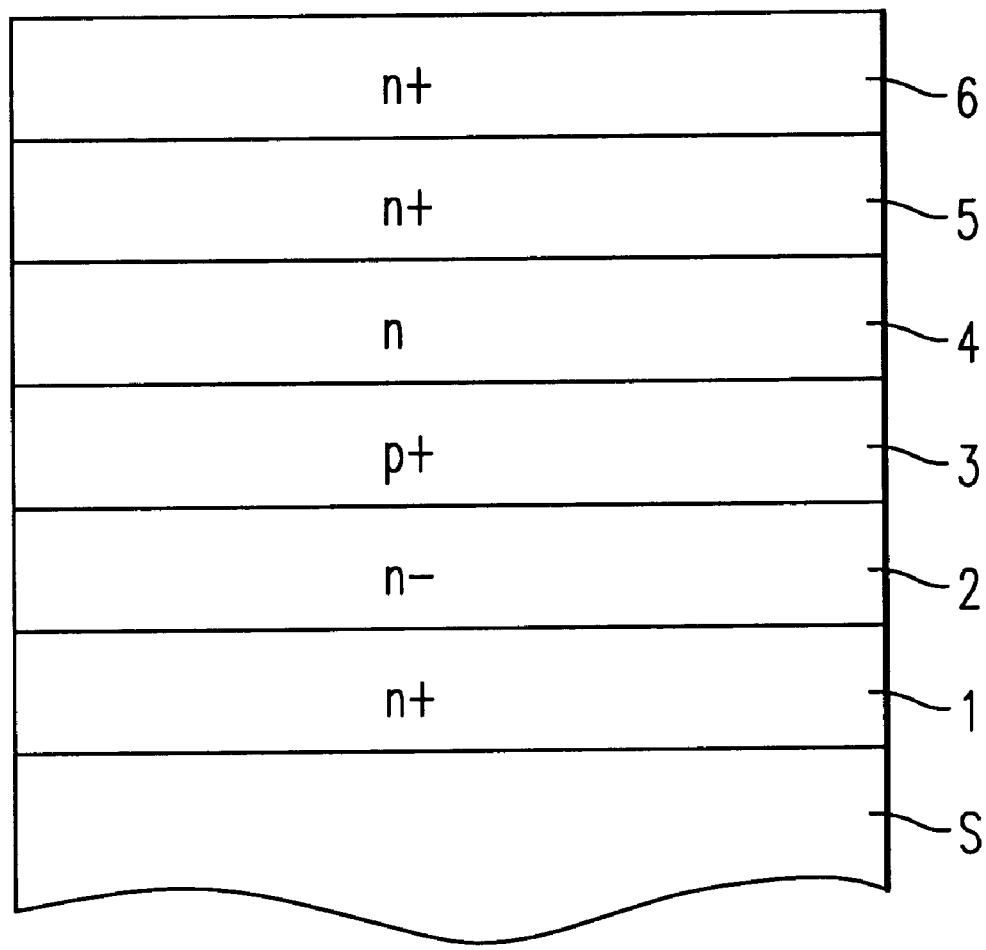
FIG. 1 illustrates a background HBT structure grown using MBE or OVMPE.

Referring now to the drawings, wherein like reference numerals designate identical or corresponding parts throughout the several views, a preferred embodiment of the present invention will now be discussed.

Zn is a column II acceptor dopant in the periodic table which on a group III site in a III/V semiconductor behaves as an acceptor. The diffusion characteristics of Zn is accurately described by the substitutional-interstitial diffusion mechanism which can lead to very high diffusion rates under certain conditions.

According to the present invention, a combination of techniques are employed in the growth of GaAs doped with Zn in HBT structures to inhibit the substitutional-interstitial diffusion mechanism, thus improving the reliability of the HBT structures. The combination of techniques include, for example, a) suppressing the creation of gallium interstitials which can activate the zinc substitutional-interstitial diffusion mechanism by, for example, minimizing n+ doping regions (e.g., to a thickness of the depletion region) to minimize zinc diffusion, b) increasing the gallium vacancy concentration in the material to suppress interstitial diffusion by, for example, the use of high V/III ratios, and c) suppressing the substitutional-interstitial diffusion mechanism by, for example, annealing during the growth of the structure to allow equilibrium concentrations of defects in the epitaxial material to be reached, thereby suppressing the substitutional-interstitial diffusion mechanism which can be driven by nonequilibrium defect concentrations.

Suppressing the creation of gallium interstitials

The creation of gallium interstitials is suppressed because they can activate the zinc substitutional-interstitial diffusing mechanism and increase the diffusion of Zn. One method to suppress the creation of gallium interstitials is, for example, minimizing the degenerate n+ doping regions.

The main purpose of the n+ doping region in HBT structures is to reduce resistance, most notably contact resistance. Degenerate n-type regions are typically used at the contact regions in the emitter and collector. The HBT structure shown in FIG. 1 has a collector contact layer 1 with a thickness of 4,000–7,000 Å and an emitter contact layer 6 with a thickness of 500–3,000 Å. However, a thickness on the order of the depletion region is all that is required to obtain low contact resistance. Thus, GaAs contact layers can be reduced to a thickness on the order of the depletion thickness.

Figure 2:
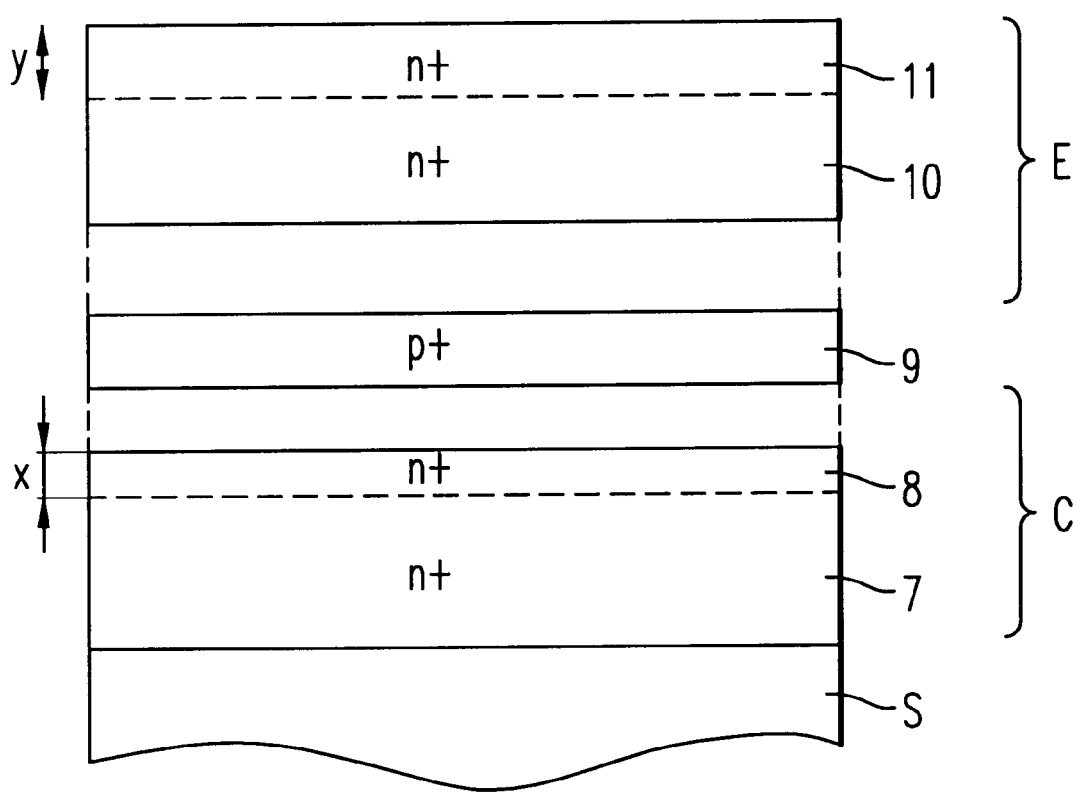
FIG. 2 illustrates an example according to the present invention of an HBT structure grown with OVMPE in which the emitter and collector contact regions are separated into a thick, moderately doped layer and a thinner, higher doped layer.

FIG. 2 illustrates an embodiment of the present invention where the emitter and collector contact regions are separated into a thinner, higher doped layer and a thicker, moderately doped layer. Layer 9 is a p-type (p+) base doped with Zn. Layers 10 and 11 are the emitter contact layers and layers 7 and 8 are the collector contact layers. The degenerate n-type doping layers 8 and 11 can be reduced to a thickness "x" and "y", respectively, which is on the order of the depletion region. The thickness "x" can be reduced to a thickness comparable to the depletion region thickness of layer 8. The thickness "y" can be reduced to a thickness comparable to the depletion region thickness of layer 11.

When the thickness of the GaAs contact layers exceeds the depletion thickness, Ga interstitials can be created because the degenerate n-type doping can drive the Fermi level or chemical potential of the material into the conduction band. Degenerate doping can be considered as a doping concentration which is high enough (e.g., an n-type doping concentration above $6 \times 10^{17}$ cm$^{-3}$ for GaAs) so that the Fermi level or chemical potential of the material is driven into the conduction band. Crystal defects which are created by the degenerate n-type doping regions can then rapidly diffuse to the base layer 9 and instigate Zn diffusion via a kick-out mechanism which is a variant of the substitutional-interstitial diffusion mechanism. In other words, the crystal defects cause an exchange reaction where gallium on an interstitial site and Zn on a substitutional site switch sites, resulting in the Zn being on an interstitial site and diffusing. Since degenerate n-type regions can initiate the diffusion, their use needs to be limited.

Thus, according to the present invention, the emitter and collector contact layer can be separated into a thicker, moderately doped layer and a thinner, higher doped layer. The layers are grown in order to simultaneously obtain a low contact resistance and to minimize n+ doping regions, thereby minimizing the diffusion of Zn. Note, that reducing the thickness of the emitter contact layer 11 to a thickness comparable to the depletion thickness of this layer does not cause a significant degradation in the emitter resistance of the emitter contact metalization to the emitter contact layer. Since this resistance is more of a function of the contact resistance to the emitter contact layer 11 (which is decreased with increased doping) than the thickness of the thicker emitter contact layer 10, the resistance is not significantly degraded.

In more detail, in FIG. 2 the collector contact maybe separated into a thicker, moderately doped layer 7 with a doping concentration between $2\times10^{18}$–$5\times10^{18}$ cm$^{-3}$ and a thickness between 4,000–7,000 Å and a thinner, higher doped layer 8 with a doping concentration between $5\times10^{18}$–$1\times10^{19}$ cm$^{-3}$ and a thickness between 200–500 Å. Likewise, the emitter contact may be separated into a thicker moderately doped layer 10 with a doping concentration between $1\times10^{18}$–$5\times10^{18}$ cm$^{-3}$ and a thickness between 500–3,000 Å and a thinner, higher doped layer 11 with a doping concentration between $5\times10^{18}$–$1\times10^{19}$ cm$^{-3}$ and a thickness between 200–500 Å. The emitter contact layer 11 may be approximately 0.1–0.5 microns from the base layer 9 and the collector contact layer 8 may be approximately 0.3–1.5 microns from the base layer 9.

Figure 3:
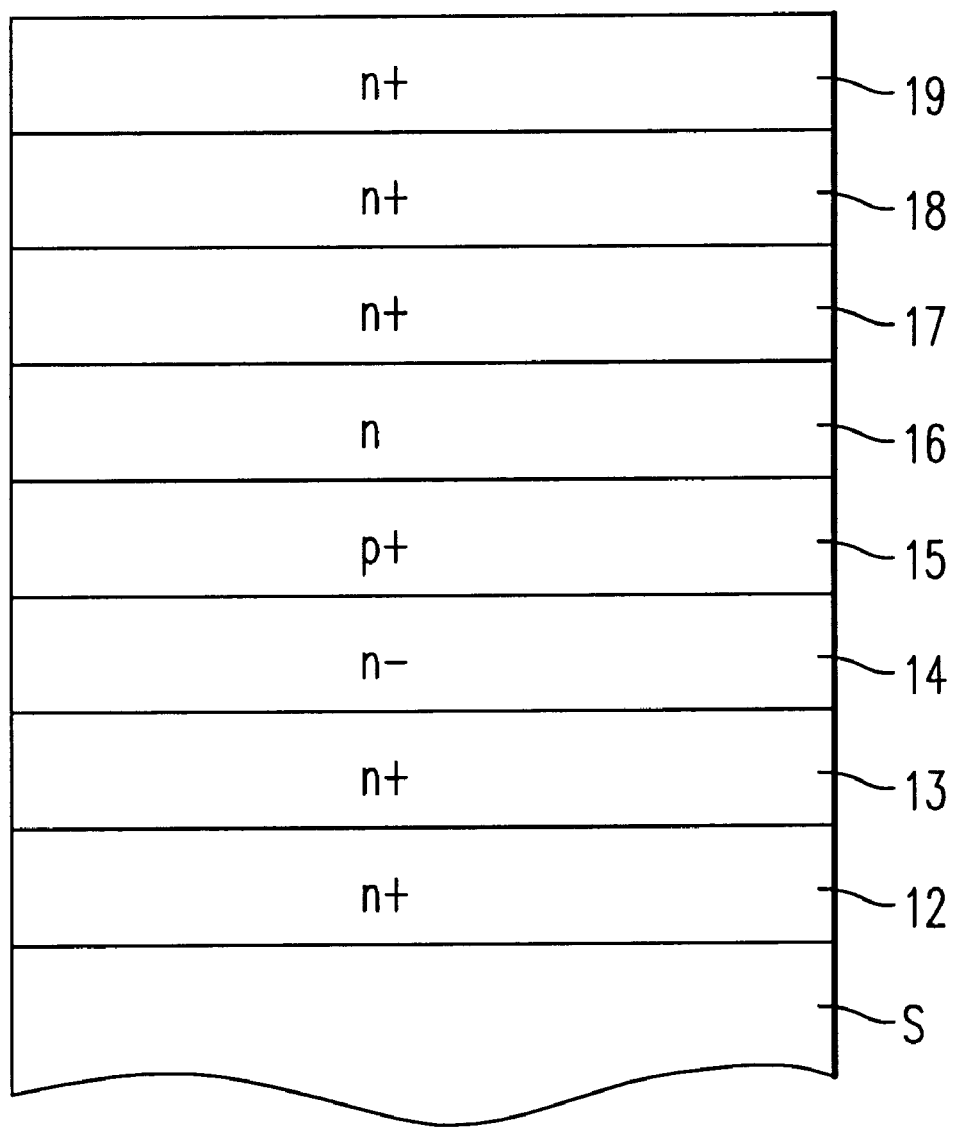
FIG. 3 illustrates another example according to the present invention of an HBT structure including eight layers of varying thicknesses and doping concentrations which are grown on a substrate with OVMPE.

FIG. 3 illustrates another example of an HBT structure according to the present invention in which an HBT structure is separated into eight layers grown on a substrate. The collector and emitter contact regions are separated into a thicker, moderately doped layer and a thinner, higher doped layer as shown in FIG. 2. That is, the thicker collector contact layer 12 has a doping concentration between $2\times10^{18}$–$5\times10^{18}$ cm$^{-3}$ and a thickness between 4,000–7,000 Å and the thinner collector contact layer 13 has a doping concentration between $5\times10^{18}$–$1\times10^{19}$ cm$^{-3}$ and a thickness between 200–500 Å. The thicker emitter contact layer 18 has a doping concentration between $1\times10^{18}$–$5\times10^{18}$ cm$^{-3}$ and a thickness between 500–3,000 Å and the thinner emitter contact layer 19 has a doping concentration between $5\times10^{18}$–$1\times10^{19}$ cm$^{-3}$ and a thickness between 200–500 Å. The emitter contact layer 11 may be 0.1–0.5 microns from the base layer 9 and the collector contact layer 8 may be approximately 0.3–1.5 microns from the base layer 9. Layer 14 is an n-type (n–) doped collector transit layer, layer 15 is a p-type (p+) base, layer 16 is an n-type doped emitter, and layer 17 is an n-type (n+) doped graded layer. Layers (14), (15), (16), and (17) have similar doping concentrations and thicknesses as that of the layers (2), (3), (4), and (5) in FIG. 1, respectively. The emitter contact layer 19 may be approximately 0.1–0.5 microns from the base layer 15 and the collector contact layer 13 may be approximately 0.3–1.5 microns from the base layer 15.

Increasing vacancies

Increasing vacancies in an HBT structure suppresses interstitial diffusion and thus, reduces the diffusion of Zn. An example of increasing the concentration of vacancies is to use high V/III ratios during the growth of an HBT structure.

A higher V/III ratio increases the group III vacancy concentration which retards the diffusion of Zn. The group III vacancy concentration can be thought of as locations where diffusing interstitial Zn can transfer to a substitutional site and stop diffusing. The definition of a high V/III ratio, according to the present invention, is a high partial pressure of an group V growth precursor relative to a group III growth precursor (i.e., arsine or tertiarybutylarsenic, and trimethylgallium for a GaAs compound) used with the OMVPE growth process. In an MBE growth process, a V/III ratio is defined as the partial pressure of the group V elemental beam to the group III elemental beam. A high V/III ratio is achieved by increasing the flow rate on the flow controller used during the growth process to dispense the group V precursor. Thus, there is greater percentage of the group V precursor than the group III precursor which increases the group III vacancies. A high V/III ratio according to the present invention is between approximately 10–100, although this depends on the situation and the particular reactor configuration.

According to the present invention and referring to the GaAs HBT of FIG. 3, high V/III ratios can be used in any one or a combination of the following layers:

in the collector transit layer 14 to prevent the diffusion of Zn from the base layer 15 towards the substrate S, and within the collector transit layer itself.

in the base layer 15 to prevent the diffusion of Zn within the base layer itself, and in the emitter layer 16 to prevent the diffusion of Zn towards the emitter layer 16 and within the emitter layer 16.

In addition, a high V/III ratio can be used each or any of the other layers to mitigate the negative effects of gallium interstitial and prevent the diffusion of Zn.

The example referring to FIG. 3 is used to clarify a method of the present invention to increase the gallium vacancy concentration to suppress the diffusion of Zn. However, the HBT structure may be separated into any number of layers containing high V/III ratios in order to increase the gallium vacancy concentration. Therefore, the present invention is not limited to an HBT structure separated into eight layers.

Suppressing the substitutional-interstitial diffusion mechanism

According to the present invention, suppressing the substitutional-interstitial diffusion mechanism reduces the diffusion of Zn. An example of suppressing the substitutional-interstitial diffusion mechanism is to use an annealing process to minimize the concentrations of gallium interstitials which can initiate Zn diffusion. As discussed above, the gallium interstitials can diffuse to a region containing Zn and cause an exchange reaction between gallium on an interstitial site and Zn on a substitutional site. That is, the Zn and gallium will switch sites causing Zn to be on an interstitial site, where the Zn can then rapidly diffuse and degrade reliability. In addition, as stated previously, the concentration of gallium interstitials increases when the Fermi level rises into the conduction band if high concentrations of n-type doping are used.

Thus, according to the present invention and referring to FIG. 3, annealing can be performed after growth of the n-type collector layers 12 and 13 or after growth of some or all of the collector transit layer 14, but before growth of the base layer 15. However, the annealing process is not appropriate after growth of the emitter layers because this may cause some gallium interstitials to diffuse towards the base and instigate Zn diffusion. For this reason, the preferred approach to dealing with gallium interstitials generated in the emitter is to minimize the n-type doping regions as discussed above.

The growth of the structure is stopped to anneal the material and allow crystal defects created in the n-type collector contact to diffuse to the surface and/or regions of lower concentrations and out of the material. This will reduce the defects which can subsequently diffuse to the base and kick-out Zn once the base is subsequently grown. During the annealing process the crystal defects caused by gallium interstitials will diffuse into the substrate and/or surface where they can annihilate or otherwise effectively leave the structure before the growth of the base. The annealing is performed for a predetermined time and at a predetermined temperature to allow an equilibrium state to be reached or to allow a non-equilibrium state to become an equilibrium state. For example, an equilibrium state could be considered as the state when the gallium interstitials have completed transferring to the substrate and/or surface.

The time required to obtain for the desired equilibrium state to be reached is dependent on the temperature used. The temperature used to anneal the material is generally higher than the temperature used for growing the HBT structure. For example, if an HBT structure is grown at a temperature of 700° C., the annealing temperature may be 800° C. The time required to anneal may be from 1 minute to 1 hour. However, production costs are increased due a longer annealing period (i.e., the number of HBT structures made per hour decreases with a longer annealing period) and therefore, it is preferably to decrease the amount of annealing time needed, if possible.

Therefore, according to the present invention, an HBT structure with Zn base doping is grown with OMVPE using a combination of techniques to control the diffusion characteristics of Zn and which will exhibit superior performance and reliability than that compared to a HBT structure using carbon as the p-type base doping material. In particular, the present invention is applicable to GaAs-based HBT structures but it may also be used for InP-based HBT structures.

Obviously, numerous modifications and variations of the present invention, including variations of doping thicknesses and doping concentrations, are possible in light of the above teachings. It is therefore to be understood that within the scope of the appended claims, the invention may be practiced otherwise than as specifically described herein.

What is claimed is:

1. A method for making a heterojunction bipolar transistor structure with organometallic vapor phase expitaxy comprising the steps of:

growing a collector;

growing a base doped with zinc on said collector; and growing an emitter on said base;

wherein at least one of the steps of growing said collector and emitter further comprises growing a first contact region and growing a thinner second contact region with a higher doping concentration than said first contact region;

wherein the step of growing the emitter comprises:
growing said second contact layer to a thickness of an associated depletion region.

2. The method according to claim 1, wherein the step of growing said emitter comprises:

growing said first contact region to a thickness between 500–3000 Å with a doping concentration between $1 \times 10^{18}$ and $5 \times 10^{18}$ cm$^{-3}$; and growing said second contact region to a thickness between 200–500 Å with a doping concentration between $5 \times 10^{18}$ and $1 \times 10^{19}$ cm$^{-3}$.

3. The method according to claim 1, wherein the step of growing said collector comprises:

growing said first contact region to a thickness between 4000–7000 Å with a doping concentration between $2 \times 10^{18}$ and $5 \times 10^{18}$ cm$^{-3}$; and growing said second contact region with a thickness between 200–500 Å and having a doping concentration between $5 \times 10^{18}$ and $1 \times 10^{19}$ cm$^{-3}$.

4. The method according to claim 2, wherein the step of growing the second contact region comprises growing the second contact region spaced from approximately 0.3 to 1.5 microns from the base region.

5. The method according to claim 3, wherein the step of growing the thinner second contact region comprises growing the second contact region spaced from approximately 0.1 to 0.5 microns from the base region.

6. The method according to claim 1, wherein the step of growing said collector, said base, and said emitter further comprises the step of:

using a V/III ratio between approximately 10 and 100.

7. The method according to claim 1, wherein the step of growing said first contact region further comprises the step of:

using a V/III ratio between approximately 10 and 100.

8. The method according to claim 1, wherein the step of growing said second contact region further comprises the step of:

using a V/III ratio between approximately 10 and 100.

9. The method according to claim 1, further comprising:

annealing, after the step of growing said collector and before the step of growing said base.

10. The method according to claim 1, further comprising:

annealing, after the step of growing said first contact region and before the step of growing said base.

11. The method according to claim 1, further comprising:

annealing, after the step of growing said second contact region and before the step of growing said base.

12. The method according to claim 1, wherein the step of growing the emitter comprises:

growing said second contact layer to a thickness of an associated depletion region.

13. A method for making a heterojunction bipolar transistor structure with organometallic vapor phase expitaxy comprising the steps of:

growing a collector:

growing a base doped with zinc on said collector; and growing an emitter on said base;

wherein at least one of the steps of growing said collector and emitter further comprises growing a first contact region and growing a thinner second contact region with a higher doping concentration than said first contact region;

wherein the step of growing the collector comprises:
growing said second contact layer to a thickness of an associated depletion region.

14. A method for making a heterojunction bipolar transistor structure with organometallic vapor phase expitaxy comprising the steps of:

growing a collector;

growing a base doped with zinc on said collector; and growing an emitter on said base;

wherein at least one of the steps of growing said collector and emitter further comprises growing a first contact region and growing a thinner second contact region with a higher doping concentration than said first contact region;

wherein:
growing said collector comprises growing a first collector contact region and growing a thinner second collector contact region with a higher doping concentration than said first collector contact region and a thickness of an associated depletion region; and growing said emitter comprises growing a first emitter contact region and growing a thinner second emitter contact region with a higher doping concentration that said first emitter contact region and a thickness of an associated depletion region.

15. The method according to claim 1, comprising:

growing only said collector to have a first collector contact region and growing a thinner second collector contact region with a higher doping concentration than said first collector contact region and a thickness of an associated depletion region.

16. The method according to claim 9, further comprising:

performing no other annealing step after growing said base.

17. The method according to claim 10, further comprising:

performing no other annealing step after growing said base.

18. The method according to claim 11, further comprising:

performing no other annealing step after growing said base.

* * * * *